United States Patent [19]
Higuchi

[11] Patent Number: 6,144,047
[45] Date of Patent: *Nov. 7, 2000

[54] SEMICONDUCTOR DEVICE HAVING IMPURITY CONCENTRATIONS FOR PREVENTING A PARASITIC CHANNEL

[75] Inventor: Minoru Higuchi, Tokyo, Japan

[73] Assignee: NEC Corporation, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 09/014,108

[22] Filed: Jan. 27, 1998

[30] Foreign Application Priority Data

Feb. 4, 1997 [JP] Japan .................................. 9-021593

[51] Int. Cl.⁷ ............................ H01L 29/74; H01L 29/76
[52] U.S. Cl. ......................... 257/141; 257/331; 257/341
[58] Field of Search ..................... 257/374, 394, 257/398, 510, 506, 515, 301, 344, 138, 139, 141, 147, 330, 331, 332, 333, 334, 335, 341, 345, 349, 401, 408; 438/247, 302, 228

[56] References Cited

U.S. PATENT DOCUMENTS

| | | | |
|---|---|---|---|
| 5,012,312 | 4/1991 | Kawamoto | 257/398 |
| 5,019,876 | 5/1991 | Nishizawa | 257/401 |
| 5,236,861 | 8/1993 | Otsu | 438/444 |
| 5,401,998 | 3/1995 | Chiu et al. | 257/515 |
| 5,424,567 | 6/1995 | Chen | 257/344 |
| 5,498,564 | 3/1996 | Geissler et al. | 438/302 |
| 5,541,430 | 7/1996 | Terashima | 257/342 |
| 5,581,100 | 12/1996 | Ajit | 257/331 |
| 5,643,822 | 7/1997 | Furukawa et al. | 438/421 |
| 5,798,553 | 8/1998 | Furukawa et al. | 257/394 |
| 5,891,787 | 4/1999 | Gardner et al. | 438/424 |

FOREIGN PATENT DOCUMENTS

| | | |
|---|---|---|
| 59-80941 | 5/1984 | Japan . |
| 59-92549 | 5/1984 | Japan . |
| 61-54641 | 3/1986 | Japan . |

*Primary Examiner*—Wael Fahmy
*Assistant Examiner*—William David Coleman
*Attorney, Agent, or Firm*—Foley & Lardner

[57] ABSTRACT

A semiconductor device is herein disclosed which comprises a plurality of element regions 50 formed on a first conductive type semiconductor substrate 60, element isolation regions 58 for isolating the element regions from each other, and gate electrodes 54 on parts of the element regions, the element regions being in contact with the element isolation regions at side surfaces 68 of the element regions, wherein in the element region under each gate electrode, the concentration of a first conductive type impurity is high in an element region top surface edge area (in the vicinity of 66), and on the side surfaces of each element region, except the portions under the gate electrode, the concentration of the first conductive type impurity is equal to or lower than that of the first conductive type impurity in the body of the element region.

According to the present invention, in the semiconductor device having a trench isolation, the formation of a parasitic channel at element region top surface edges under a gate electrode can be prevented and a leak current in an OFF state can be reduced without any increase in a junction capacitance which retards the driving velocity of elements and without any increase in a junction leak current.

3 Claims, 5 Drawing Sheets

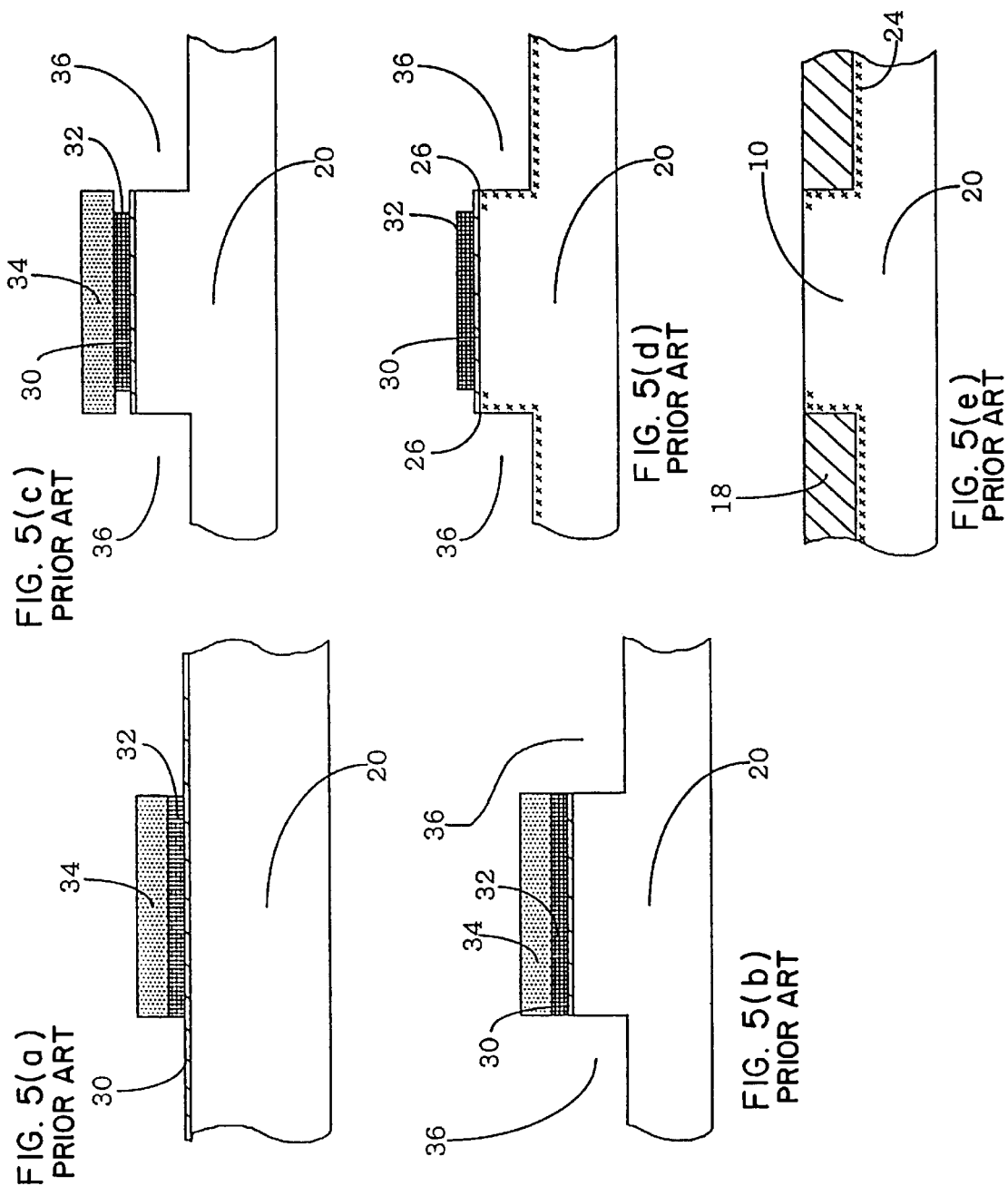

SEMICONDUCTOR DEVICE HAVING IMPURITY CONCENTRATIONS FOR PREVENTING A PARASITIC CHANNEL

BACKGROUND OF THE INVENTION

1. Field of the Invention

The present invention relates to a semiconductor device having a plurality of elements and isolation regions for isolating these elements on a substrate, and more specifically, it relates to a semiconductor device in which element isolation regions are formed by digging trenches on a semiconductor substrate and filling these trenches with an insulating film, and a method for manufacturing the semiconductor device.

2. Description of the Prior Art

As a technique for the mutual isolation of elements formed on a semiconductor substrate in a semiconductor device, there has been used a method which comprises isolating the elements from each other by digging trenches between element regions on the semiconductor substrate, and filling these trenches with an insulating film (hereinafter referred to simply as "the trench isolation"). This trench isolation is a very useful technique for the mutual isolation of the elements in the finely highly integrated semiconductor device, because the size of the semiconductor device depends on the precisely formed trenches on the semiconductor substrate.

However, when a voltage is applied to a gate electrode, an electric field is concentrated along element region top surface edge on the semiconductor substrate under the gate electrodes, so that parasitic channels having a lower gate voltage than an original threshold voltage are formed in these portions. In consequence, a problem that a leak current increases in an OFF state tends to take place.

As a technique for solving this problem, there are known methods described in Japanese Patent Application Laid-open Nos. 92549/1984 and 54641/1986, and in Japanese Patent publication (Kokoku) No. 54468/1991. That is to say, according to these methods, the same conductive type impurity as in the substrate is introduced into surfaces of the semiconductor substrate that are in contact with an insulating film in element isolation regions to heighten the concentration of the impurity therein, whereby the formation of the parasitic channels is prevented.

One example of these conventional methods will be described with reference to drawings. A semiconductor device having the conventional trench isolation is shown in FIGS. 4(a) to 4(c). In FIG. 4(a), a part of the semiconductor device is seen from above the element top surface, and an element region 10 is constituted of a source region 12, a gate electrode 14 and a drain region 16, and this element region is isolated from another element by an element isolation region 18. FIG. 4(b) is a cross-sectional view of the gate electrode 14 cut along the line 4(b)—4(b) in FIG. 4(a), and FIG. 4(c) is a cross-sectional view of the drain region 16 cut along the line 4(b)—4(b) in FIG. 4(a).

In the cross-section along the line 4(b)—4(b), as shown in FIG. 4(b), a gate insulating film 22 and the gate electrode 14 are disposed on the element region 10 on a first conductive type semiconductor substrate 20, and the element region 10 is isolated from another element by the element isolation region 18 which is formed by digging a trench on the semiconductor substrate 20 and filling the trench with the insulating film. That is to say, the element region 10 has a substantially flat top surface and comes in contact with the element isolation regions near element region top surface edges 26. A side surface 28 of the element region is a vertical or an inclined wall surface extending from the top surface edge of the element region and the bottom of the trench and comes in contact with the insulating film in the element isolation region 18.

In this conventional example, when a voltage is applied to the gate electrode 14, the concentration of an electric field occurs along the element region top surface edges 26 under the gate electrode 14, generating a parasitic channel. As a means to solve this problem the concentration of the first conductive type impurity in substrate surfaces 29 which are in contact with the bottom of the element isolation region 18, the element region side surface 28 and the element region top surface edge 26 is set so as to be higher than in the body of the element region.

Furthermore, in the cross-section along the line 4(c)—4(c), as shown in FIG. 4(c), the drain region 16 containing a second conductive type impurity is formed on the semiconductor substrate surface in the element region 10, and this element region 10 is isolated from another element by the element isolation region 18 formed by digging the trench on the semiconductor substrate 20 and filling the trench with the insulating film. In the substrate surface 24 which is in contact with the trench bottom of the element isolation region 18 and a portion of the element region side under the drain region 16, the first conductive type impurity is present at a higher concentration than in the body of the element region. Incidentally, in FIG. 4, wires and the like on the shown element are omitted to avoid complexity.

FIGS. 5(a) to 5(e) show a cross-section along the line 4(b)—4(b) in FIG. 4(a) which explains a manufacturing method of the semiconductor device having such a conventional trench isolation as shown in FIG. 4.

As shown in FIG. 5(a), a silicon oxide film 30 is formed on a first conductive type silicon substrate (a semiconductor substrate) 20, and additionally, on the silicon oxide film 30, for example. An aluminum film (a mask material) 32 having a thickness of 0.5 μm is formed, followed by forming a mask comprising the aluminum film 32 and a resist film 34 by lithography. Next, as shown in FIG. 5(b), the semiconductor substrate 20 is subjected to anisotropic etching through the above-mentioned mask to form trenches 36 for element isolation regions having a depth of about 0.6 μm.

In succession, as shown in FIG. 5(c), the side walls of the aluminum film 32 are partially etched by isotropic etching so that the aluminum film 32 may retract as much as about 0.1 μm.

As shown in FIG. 5(d), the resist film 34 for the mask is peeled off, and the first conductive type impurity is then implanted into the semiconductor substrate 20 by using the retracted aluminum film 32 as a mask, a dose of the impurity being, for example, $3 \times 10^{12}$ cm$^{-2}$ ions. At this time, the ion is implanted into the bottoms and the sides of the trenches 36 for the isolation regions as well as the element region top surface edge 26 which is not masked with the aluminum film 32.

Next, as shown in FIG. 5(e), the trenches 36 for the element isolation regions are filled with, for example, a CVD silicon oxide film (an insulating film). The above-mentioned aluminum film 32 is removed, and the surfaces of the filled isolation regions are flattened. In succession, a usual procedure is carried out to form the gate oxide film 22 and the gate electrode 14 shown in FIG. 4. Furthermore, the second conductive type impurity is ion-implanted, thereby forming the source region 12 and the drain region 16, whereby a semiconductor device having the trench isolation is completed.

However, in the conventional technique, on the side of the element region as shown in FIG. 4(c), the drain region 16 containing the second conductive type impurity is in contact with the side surface containing the first conductive type impurity at a high concentration, and therefore some problems are present. For example, a junction capacitance increases and retards the driving velocity of the elements, and a junction leak current increases inconveniently.

In particular, with the progress of high integration through the formation of fine elements, in the semiconductor integrated circuit apparatus in which a semiconductor device having a trench isolation is used, the total peripheral length of the element regions per chip increases, so that junctions having a high impurity concentration which is in contact with the drain region 16 on the side wall of the element isolation region 18 increase more and more, which is considered to be a serious problem.

SUMMARY OF THE INVENTION

Accordingly, an object of the present invention is to provide a semiconductor device having a trench isolation which can prevent the formation of a parasitic channel along an element region top surface edge under a gate electrode and can reduce a leak current in an OFF state without any increase in a junction capacitance which retards the driving velocity of elements and without any increase in a junction leak current.

Another object of the present invention is to provide a method for manufacturing the above-mentioned semiconductor device.

The first aspect of the present invention is directed to a semiconductor device which comprises a plurality of element regions formed on a first conductive type semiconductor substrate, element isolation regions for isolating the element regions from each other, and gate electrodes on parts of the element regions, the element regions being in contact with the element isolation regions at side surfaces of the element regions, wherein:

in the element region under each gate electrode, the concentration of a first conductive type impurity is higher in element region top surface edge areas than in the body of the element region, and on the side surfaces of each element region, except those portions at the top surface of the element body, the concentration of the first conductive type impurity is equal to or lower than in the body of the element region.

The second aspect of the present invention is directed to a method for manufacturing a semiconductor device described in claim 1, which comprises a step of forming a plurality of masks on positions on a first conductive type semiconductor substrate surface where a plurality of element regions are formed, a step of etching the semiconductor substrate by the use of the masks to form trenches which become element isolation regions, a step of retracting the sides of the masks by isotropic etching to expose element region top surface edge areas of the semiconductor substrate surface, a step of ion-implanting a first conductive type impurity into the exposed element region top surface edge areas of the semiconductor substrate surface in such a manner that the depth of the ion from the surface is smaller than the depth of source regions and drain regions which are to be formed in a subsequent step and the ion is not implanted into the side surfaces of the element region, a step of filling the trenches with an insulating film after the ion implantation, a step of ion-implanting the first conductive type impurity thereinto after the removal of the masks, a step of forming a plurality of gate insulating films on the semiconductor substrate surface of the element regions, a step of forming a conductive layer on the gate insulating films, a step of patterning this conductive layer to form a plurality of gate electrodes, and a step of ion-implanting a second conductive type impurity thereinto to form the source region and the drain regions.

In the present invention, the concentration of the first conductive type impurity in the element region top surface edge areas under each gate electrode is kept high, and the concentration of the first conductive type impurity in the element isolation side surfaces, except under the gate electrode, is set to a low level. Therefore, on the element region side, surfaces except those portions at the top surface of the element body, the second conductive type region such as a drain region does not come in contact with the first conductive type impurity of a high concentration, so that in this portion, neither a junction capacitance nor a junction leak current increases.

Thus, the formation of a parasitic channel can be prevented and a leak current can be reduced in the OFF state, and simultaneously a junction capacitance can be decreased, whereby a junction leak current can be reduced. The present invention is preferably applied to a semiconductor device including a MOS type FET.

BRIEF DESCRIPTION OF THE DRAWINGS

FIGS. 5(A)–5(E) is another illustrative view of the conventional technique.

Figure 1A:
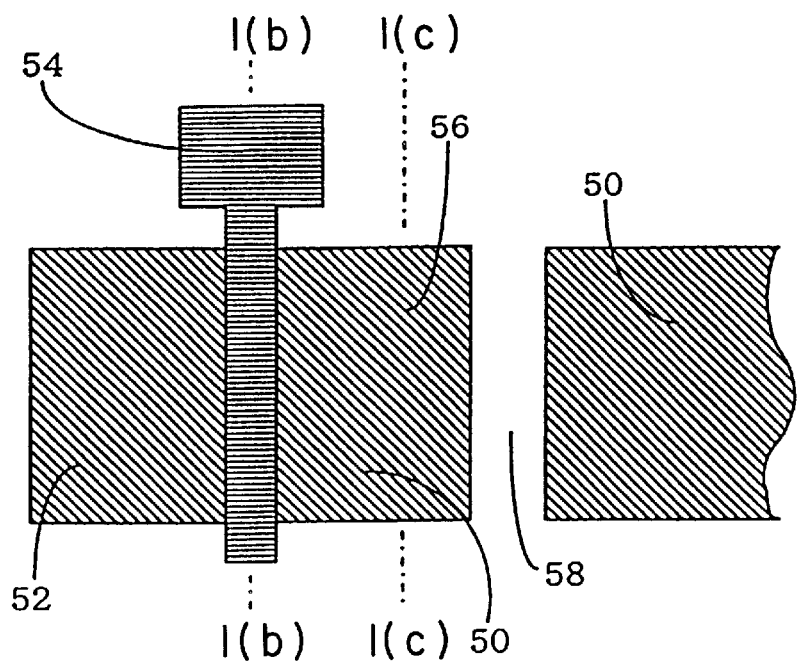
FIGS. 1(A)–1(C) is an illustrative view of an example regarding the present invention.

Explanation of symbols:

10 . . . Element region
12 . . . Source region
14 . . . Gate electrode
16 . . . Drain region
18 . . . Element isolation region
20 . . . Semiconductor substrate
22 . . . Gate insulating film
24 . . . Ion-implanted first conductive type impurity
26 . . . Element region top surface edge
28 . . . Element region side surface
29 . . . Trench bottom substrate surface
30 . . . Silicon oxide film
32 . . . Aluminum film
34 . . . Resist film
36 . . . Trench of element isolation region
50 . . . Element region
52 . . . Source region
54 . . . Gate electrode 56 . . . Drain region
58 . . . Element isolation region
60 . . . Semiconductor substrate
62 . . . Gate insulating film
64 . . . Ion-implanted first conductive type impurity
66 . . . Element region top surface edge
68 . . . Element region side surface
68b . . . Element region side surface
69 . . . Trench bottom substrate surface
70 . . . Silicon oxide film
72 . . . Silicon nitride film
74 . . . Resist film
76 . . . Trench of element isolation region
80 . . . Side wall

DETAILED DESCRIPTION OF THE INVENTION

Figure 1B:
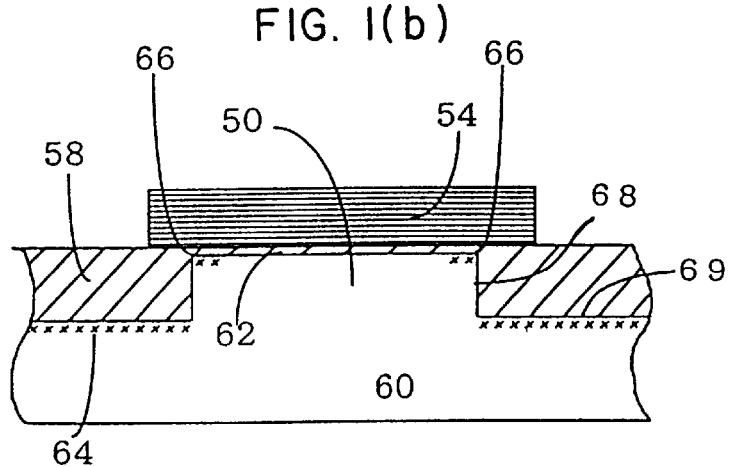
Figure 1C:
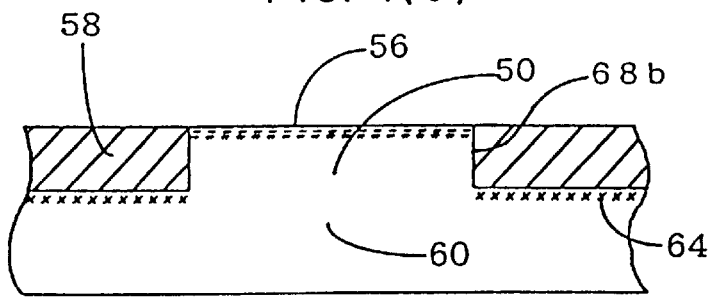

The structure of a semiconductor device according to the present invention is shown in FIG. 1(a) to FIG. 1(c). Incidentally, in FIG. 1, wires and the like of the shown element are omitted to avoid complexity.

In FIG. 1(a), a part of the semiconductor device is seen from above the element surface, and an element region 50 comprises a source region 52 and a drain region 56. The element region 50 is isolated from another element by an element isolation region 58. A gate electrode 54 is placed on a portion of the element region 50.

FIG. 1(b) is a cross-section of the gate electrode 54 cut along the line 1(b)—1(b) in FIG. 1(a), and FIG. 1(c) is a cross-section of the drain region 56 cut along the line 1(c)—1(c) in FIG. 1(a). In the cross-section along the line 1(b)—1(b), as shown in FIG. 1(b), a gate insulating film 62 and the gate electrode 54 are disposed on the element region 50 on a first conductive type semiconductor substrate 60, and the element region 50 is isolated from another element by the element isolation region 58 which is formed by digging a trench on the semiconductor substrate 60 and filling the trench with the insulating film. The element region 50 has substantially flat surfaces and comes in contact with the element isolation region 58 near element region top surface edges 66. A side surface 68 of the element region is a vertical or an inclined wall surface extending from the end of the element region to the bottom of the trench and is in contact with the insulating film in the element isolation region 58.

In the present invention, as shown in FIG. 1(b), in the element region top surface edge areas, a first conductive type impurity is present at a higher concentration than in the body (i.e. the non-top surface edge portions) of the element region. When a voltage is applied to the gate electrode 54, this constitution can prevent generating a parasitic channel caused by the concentration of an electric field along the element region top surface edges 66 under the gate electrode 54. This inhibits the increase in a leak current in an OFF state. Incidentally, in the drawing, the first conductive type impurity is also present at a high concentration in a substrate surface 69 of the trench bottom in the element isolation region 58, but such a presence is not particularly necessary in the present invention.

Furthermore, in the cross-section along the line 1(c)—1(c), as shown in FIG. 1(c), the drain region 56 containing a second conductive type impurity is formed on the semiconductor substrate surface in the element region 50, and this element region 60 is isolated from another element by the element isolation region 58 formed by digging the trench on the semiconductor substrate 60 and filling the trench with the insulating film.

In the portions of the element region side surface 68b under the drain region 56, the first conductive type impurity is present at a concentration equal to or lower than that of a portion at the same depth in the body of the element region.

That is to say, in the semiconductor structure of the present invention, the first conductive type impurity is present at a high concentration in the surface of the element region in the vicinity of the element region top surface edges, and on the other hand, the first conductive type impurity is not present at a high concentration in the side surface of the element region.

In this case, a range where the concentration of the first conductive type impurity in the element region under the gate electrode should be heightened is preferably between each element region top surface edge and a point 0.01 $\mu$m or more distant from this edge, because such a constitution can prevent the generation of the parasitic channel. Furthermore, even if the range of the high impurity concentration is greater than required, no further improvement is observed. Therefore, in general, the high concentration range is preferably between each element region top surface edge and a point 0.1 $\mu$m or less distant from this edge.

In addition, in the element region side surface, except those portions at the top surface of the element body, the concentration of the first conductive type impurity in a portion at a larger depth than a second conductive region such as the drain region is preferably equal to or lower than that of the first conductive type impurity in the body of the element region. Usually, in the portion at a larger depth than 0.1 $\mu$m, the impurity concentration is preferably set so as to be equal to or lower than that of the body of the element region.

Some examples of a method for manufacturing the above-mentioned semiconductor device will be described as follows.

EXAMPLE 1

(First manufacturing method)

Figure 2A:
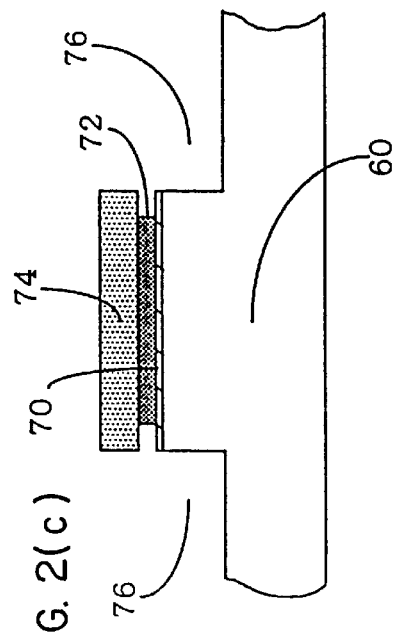
FIGS. 2(A)–2(E) is another illustrative view of the example regarding the present invention.
Figure 2B:
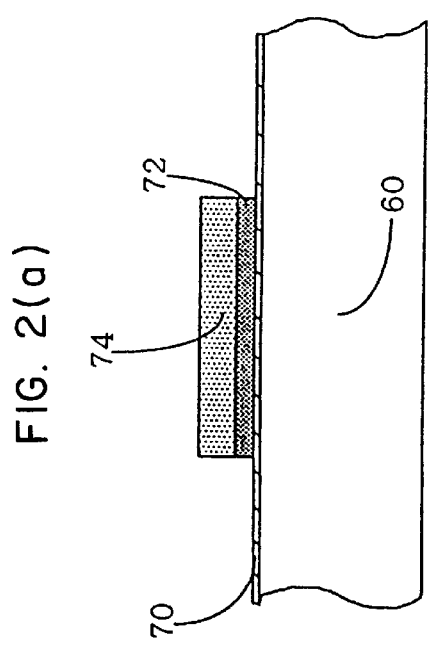

In FIG. 2(a) to FIG. 2(e), a method for manufacturing a semiconductor device shown in FIG. 1 is exhibited by a cross-section along the line A'—A' in FIG. 1(a). As shown in FIG. 2(a), a silicon oxide film 70 was formed on a first conductive type silicon substrate (a semiconductor substrate) 60, and on this silicon oxide film 70, a silicon nitride film (a mask) 72 having, for example, a thickness of 0.4 $\mu$m was formed. On the element region, a mask comprising the silicon nitride film 72 and a resist film 74 was formed by lithography. Next, as shown in FIG. 2(b), the semiconductor substrate 60 was subjected to anisotropic etching by the use of the mask to form trenches 76, of element isolation regions, having a depth of about 0.5 $\mu$m.

Figure 2C:
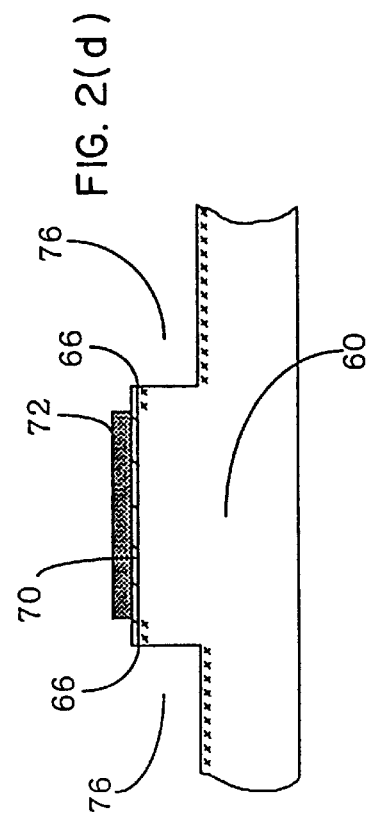
Figure 2D:
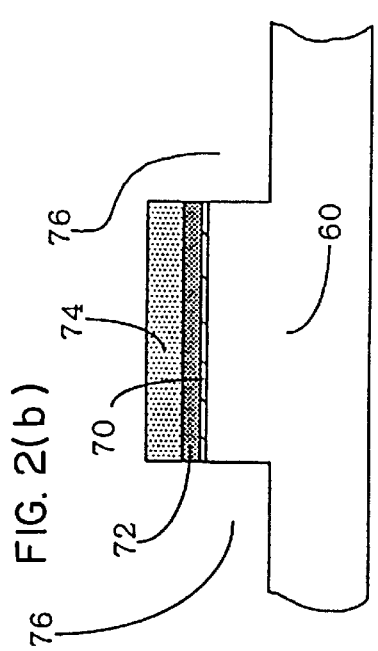

In succession, as shown in FIG. 2(c), the silicon nitride film 72 was partially etched from the sides by isotropic etching to retract the silicon nitride film 72. As shown in FIG. 2(d), the resist film 74 for the mask was peeled off, and a first conductive type impurity was then ion-implanted into the semiconductor substrate 60 vertically to the surface of the semiconductor substrate 60 through the surface of the semiconductor substrate 60 by using the retracted silicon nitride film 72 as a mask, the dose of the impurity being usually in the range of $3\times10^{12}$ cm$^{-2}$ to $1\times10^{14}$ cm$^{-2}$, for example, about $7\times10^{12}$ cm$^{-2}$. At this time, the ion implantation was carried out into the bottoms of the trenches 76 of the element isolation regions and the element region top surface edge areas (including the element region ends 66) which were not masked with the silicon nitride film 72. In this case, the depth of the implantation was smaller than the junction depth of a second conductive type element region, i.e., a source region and a drain region which would be formed in a subsequent step. In the usual semiconductor device, the depth of the implantation is preferably about 0.1 μm (e.g., in the range of 0.05 to 0.15 μm) in terms of the depth of the peak of an impurity concentration.

Figure 2E:
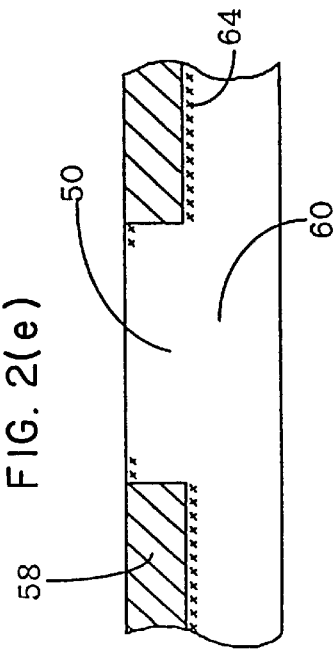

Next, as shown in FIG. 2(e), the trenches 76 of the element isolation regions were filled with, for example, a CVD silicon oxide film (an insulating film). The silicon nitride film 72 is then removed, and the surfaces of the filled isolation regions are flattened. In succession, a usual procedure was carried out to form such a gate oxide film (gate insulating film) 62 and a gate electrode 54 as shown in FIG. 1. Furthermore, a second conductive type impurity was ion-implanted thereinto by using the gate electrode as a mask, thereby forming a source region 52 and a drain region 56, whereby a semiconductor device having a trench isolation was completed.

EXAMPLE 2

(Second manufacturing method)

Figure 3A:
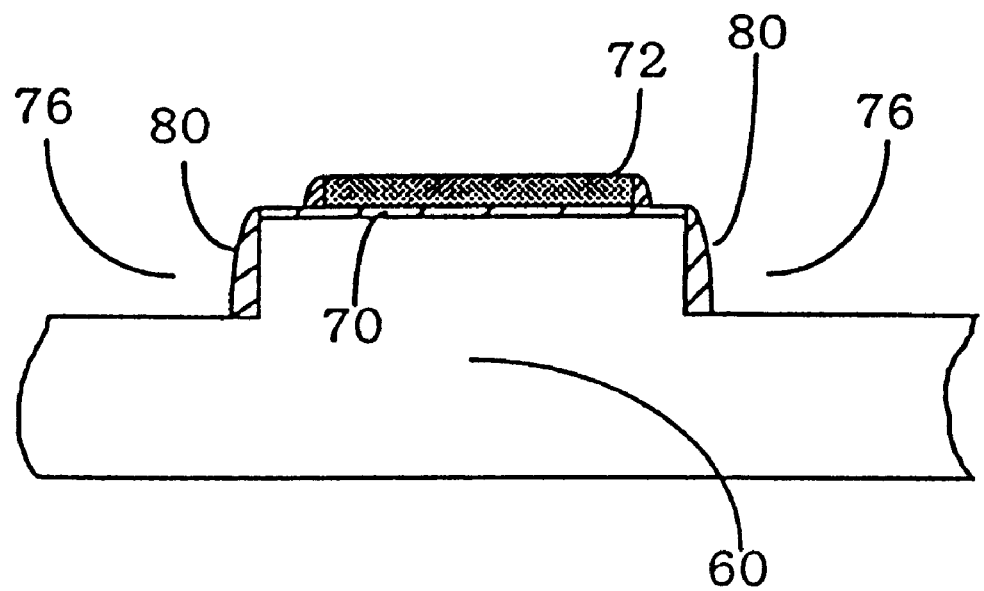
FIGS. 3(A)–3(B) is still another illustrative view of the example regarding the present invention.

After a process progressed until the formation of a structure shown in FIG. 2(c) in the same manner as in the first manufacturing method, a resist film 74 for a mask was peeled off as shown in FIG. 3(a). Afterward, a CVD silicon oxide film (an insulating film) was deposited as thick as usually 50 to 150 nm, for example, 80 nm, and the thus deposed CVD silicon oxide film (the insulating film) was then subjected to anisotropic etching, thereby selectively forming side walls 80 on the side surfaces of the trench 76 of the element isolation regions.

Figure 3B:
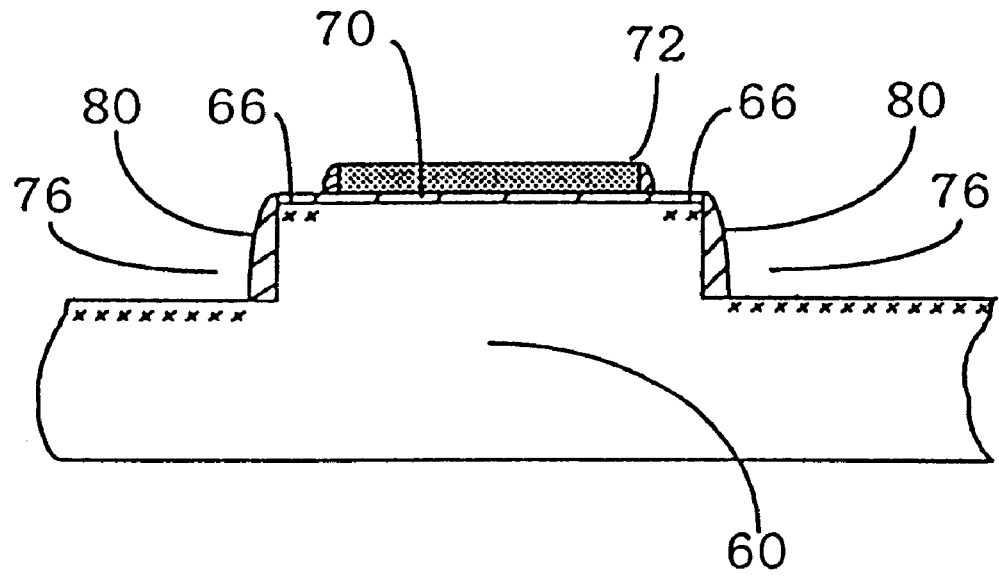
Figure 4A:
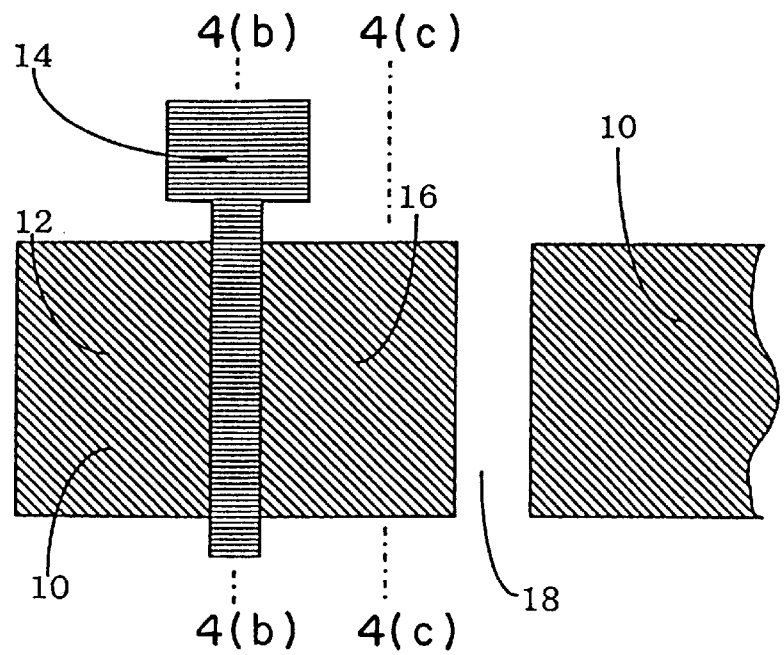
FIGS. 4(A)–4(C) is an illustrative view of a conventional technique.
Figure 4B:
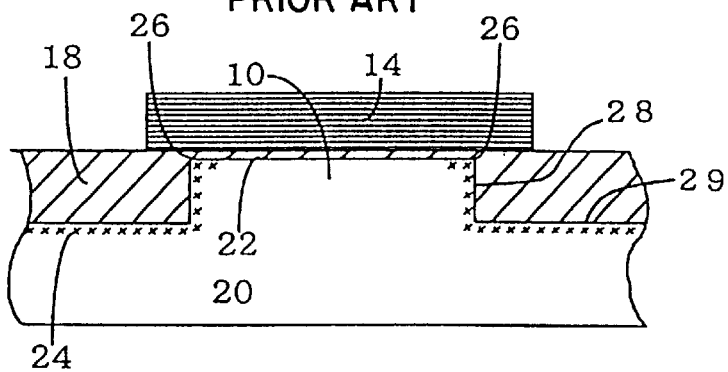
Figure 4C:
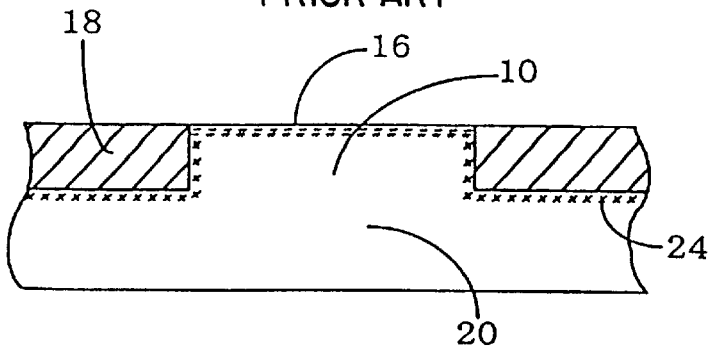

Next, as shown in FIG. 3(b), a first conductive type impurity was ion-implanted into a semiconductor substrate 60 vertically to the surface of the semiconductor substrate 60 by using the retracted silicon nitride film 72 and the side walls 80 as the masks. The depth of the implantation from the surface of the semiconductor substrate 60 is set smaller than a junction depth of a source region and a drain region which would be described hereinafter, and the dose of the impurity is about $7 \times 10^{12}$ cm$^{-2}$. In this case, the dose of the impurity, the depth of the implantation and the like can be changed as described in the first manufacturing method.

At this time, the ion implantation was carried out into the bottoms of the trenches 76 of the element isolation regions and the element region top surface edge areas (including the element region ends 66) which were not masked with the silicon nitride film 72. Afterward, the same procedure as in the first manufacturing method was conducted to complete a semiconductor device having a trench isolation.

In the second manufacturing method, there is an advantage that the ion implantation into the sides of the element region can be entirely prevented.

In MOSFETs manufactured by the first manufacturing method and the second manufacturing method, a junction capacitance can be decreased about 20% and a leak current is lowered by one order of magnitude as compared with a case where a similar element structure is manufactured by a conventional technique. That is to say, in a semiconductor integrated circuit device in which the semiconductor device of the present invention is used, a driving velocity can be increased as much as about 20%.

Incidentally, in the manufacturing method of the present invention, the technique for ion implantation to the element region top surface edge areas is not limited to those described in the above first and second manufacturing methods, and no particular restriction is put on the ion implantation technique, so long as it is a method by which the ion is not implanted into the side surfaces of the element region.

Furthermore, prior to the ion implantation, a thin film such as an insulating film can be formed on the surface through which the ion is implanted, whereby the roughness on the surface can be prevented and the depth of the implantation can easily be controlled. When a silicon substrate is used as the substrate, the ion implantation can be carried out after a silicon oxide film having a thickness of about 10 nm (e.g., in the range of 5 to 15 nm) is formed on the surface by thermal oxidation.

According to the present invention, there can be provided a semiconductor device having a trench isolation in which the formation of a parasitic channel at element region top surface edge areas under a gate electrode can be prevented and a leak current in an OFF state can be reduced without any increase in a junction capacitance which retards the driving velocity of elements and without any increase in a junction leak current; and a method for manufacturing the semiconductor device.

What is claimed is:

1. A semiconductor device which comprises a plurality of element regions formed on a first conductive type semiconductor substrate, element isolation regions for isolating the element regions from each other, and gate electrodes overlying parts of the element regions, the element regions being in contact with the element isolation regions at side surfaces of the element regions, wherein:

the element regions have a concentration of a first conductive type impurity that is higher at top surface edge areas than the concentration of the first conductivity type impurity in the body of the element region; and the side surfaces of each element region, except those portions of the side surfaces comprising the top surface edge areas, having a concentration of the first conductive type impurity that is equal to or lower than in the body of the element region, the implant depth of the first conductive type impurity at the top surface edge areas being less than the implant depth of a second conductivity type impurity forming source/drain regions in areas of the element body that do not underlie the gate electrode.

2. The semiconductor device according to claim 1 wherein the top surface edge regions of the element region that are implanted with the first conductive type impurity extend inward for a distance ranging from 0.01 to 0.1 μm from the element region side surfaces.

3. The semiconductor device according to claim 1 wherein the first conductive type impurity of the top surface edge regions is implanted to a depth of no greater than 0.1 μm from the surface of the semiconductor substrate.

* * * * *